United States Patent
Lan et al.

(10) Patent No.: US 6,214,717 B1
(45) Date of Patent: Apr. 10, 2001

(54) METHOD FOR ADDING PLASMA TREATMENT ON BOND PAD TO PREVENT BOND PAD STAINING PROBLEMS

(75) Inventors: Chao-Yi Lan, Chung-Li; Shean-Ren Horng, Hsin-Chu; Yang-Tung Fan, Chu-Pei; Chih-Kang Chiu, Yung-Ho, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/192,339

(22) Filed: Nov. 16, 1998

(51) Int. Cl.$^7$ .................................................. H01L 21/44
(52) U.S. Cl. ........................ 438/612; 438/474; 438/637; 438/669; 438/691; 438/798
(58) Field of Search .................... 438/612, 637, 438/669, 691, 694, 474, 745, 759, 788, 792, 798, 906, 959, 974, 977

(56) References Cited

U.S. PATENT DOCUMENTS

| | | | |
|---|---|---|---|
| 4,892,616 | * | 1/1990 | Vegh et al. ............................. 156/655 |
| 5,300,172 | * | 4/1994 | Ishiwata et al. ................... 156/275.5 |
| 5,334,332 | | 8/1994 | Lee ....................................... 252/548 |
| 5,451,293 | | 9/1995 | Tabara ..................................... 216/13 |
| 5,476,816 | | 12/1995 | Mautz et al. .......................... 437/195 |
| 5,716,494 | | 2/1998 | Imai et al. .......................... 156/643.1 |
| 5,731,243 | * | 3/1998 | Peng et al. ............................. 438/612 |
| 5,824,234 | * | 10/1998 | Jou et al. ................................. 216/18 |
| 5,930,664 | * | 7/1999 | Hsu et al. .............................. 438/612 |
| 5,985,765 | * | 11/1999 | Hsiao et al. ........................... 438/694 |
| 6,006,764 | * | 12/1999 | Chu et al. .............................. 134/1.2 |
| 6,063,207 | * | 5/2000 | Yu et al. ................................... 134/2 |
| 6,093,964 | * | 7/2000 | Saitoh .................................... 257/738 |

FOREIGN PATENT DOCUMENTS

| | | |
|---|---|---|
| 59-132622 | 7/1984 | (JP) . |
| 03136240 | 6/1991 | (JP) . |
| 8-321486 | * 12/1996 | (JP) . |

OTHER PUBLICATIONS

S. Wolf, "Silicon Processing For The VLSI Era" vol. 2, 1990, Lattice Press, Sunset Beach, CA, p 542–45, 559.

* cited by examiner

Primary Examiner—Carl Whitehead, Jr.
Assistant Examiner—Alonzo Chambliss
(74) Attorney, Agent, or Firm—George O. Saile; Stephen B. Ackerman

(57) ABSTRACT

A method is disclosed for improving the bonding strength of wire bonds on semiconductor chips. Aluminum-silicon-copper is employed as the metal for wire bonding-pads. Openings are formed in the passivation layer over the bonding-pads. The exposed metal in the openings is treated with a fluorine containing F-plasma. A thin passivation film, with C, F, and O content is formed over the metal bonding pads. This protective film prevents the formation of pitting and staining of the bonding-pads when the wafer is subjected to repeated developing solutions during the color filter process performed for the CMOS image sensors, for example. Consequently, the wire bonds formed during the packaging of the chips are stronger and more reliable.

17 Claims, 3 Drawing Sheets

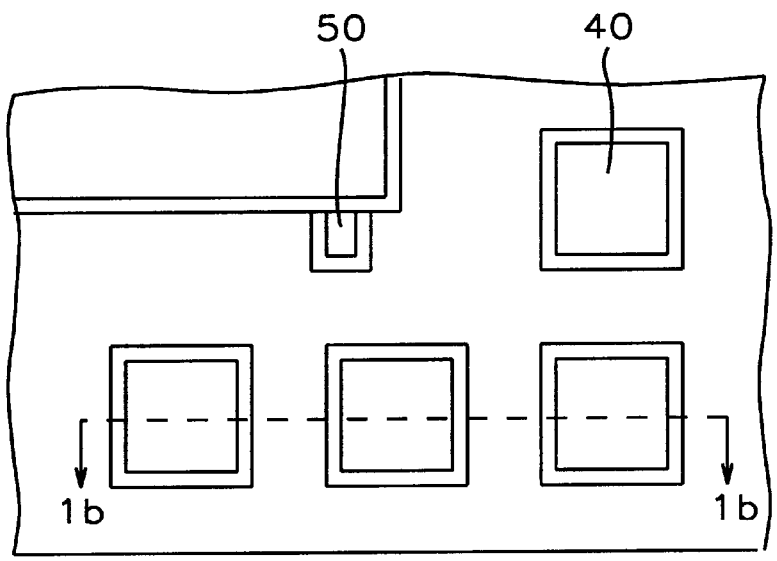
FIG. 1a - Prior Art
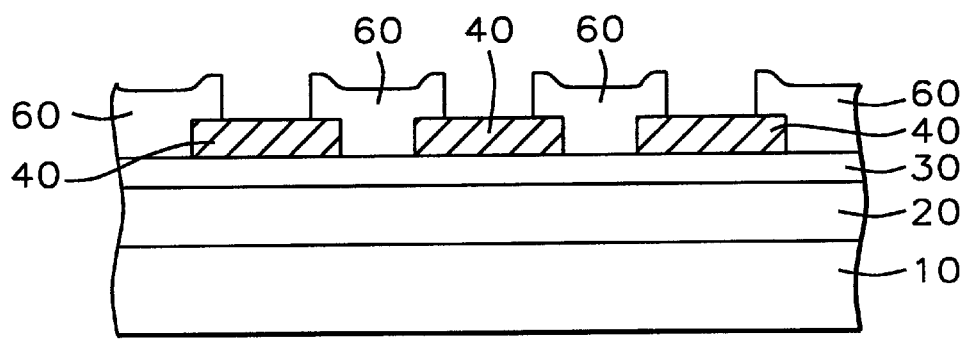
FIG. 1b - Prior Art

METHOD FOR ADDING PLASMA TREATMENT ON BOND PAD TO PREVENT BOND PAD STAINING PROBLEMS

BACKGROUND OF THE INVENTION

1. Field of the Invention

The present invention relates to semiconductor manufacturing in general, and in particular, to a method of plasma treating bonding-pads on a wafer in order to prevent bond-pad staining problem which unfavorably affects the wire bonding.

2. Description of the Related Art

In conventional semiconductor manufacturing, the device structures that are formed on a wafer are sealed from environmental contaminants and moisture by chemical vapor depositing (CVD) on the wafer a passivation, or a protective layer, such as CVD phosphosilicate glass (PSG) or plasma-enhanced CVD silicon nitride. This passivation layer also serves as a scratch protection layer. Openings are then etched into the passivation layer so that a set of underlying special metallization patterns are exposed. These metal patterns are normally located in the periphery of the integrated circuits on a wafer as shown in FIG. 1a, and are called bonding pads. Bonding pads (40) are typically 100× 100 micrometers ($\mu$m) in size and are separated by a space about 50 to 100 $\mu$m. FIG. 1b is a cross section through the bonding pads (40) of FIG. 1a formed on a wafer substrate (10) having metal and insulating layers (20), and an oxide layer (30) on which the bonding-pads are formed. Wires are bonded to the metal of the bonding pads and are then bonded to the chip package leads, as is well known in the art. A smaller pad (50) used for probing the wafer is shown in FIG. 1a for completeness, and passivation layer (60) which, initially, covers the whole surface of the wafer.

It has been found in the present state of manufacturing of CMOS devices, however, that when a color filter process is performed on the completed semiconductor substrate to form image sensors, the metal on the bond-pads is stained and pitted. The pitted metal, such as pitted AlSiCu alloy, then is found to cause a very poor quality wire bonding. A method of alleviating the bond-pad pitting problem by performing a judicious plasma treatment is disclosed later in the embodiments of the present invention.

Plasmas are generally defined to be a partially ionized gas composed of ions, electrons, and a variety of neutral species. In semiconductor manufacturing, they are usually used to perform etching of different materials, primarily silicon and oxides. As discussed more fully by Wolf, S., and Tauber, R. N. in "Silicon Processing for the VLSI Era," vol. 2, Lattice Press, Sunset Beach, Calif., 1990, pp. 542–543, usually, a glow discharge is utilized to produce chemically reactive plasma species (atoms, radicals, and ions) from a relatively inert molecular gas. These species diffuse to the surface of the material to be etched and are absorbed on the surface. Then, a chemical reaction occurs, with the formation of a volatile by-product where the by-products is desorbed from the surface and carried away by the bulk gas in the plasma.

The events that take place at the surface to produce etching of the solid material by the gas phase species involve mechanisms that relate to, among other things that are listed in Wolf, p. 545, the synergistic effects on the surface of multiple species bombardment by ions, electrons and photons, and are referred to as heterogeneous surface reactions. These heterogeneous reactions are governed by the nature of the surface that is being exposed to the plasma. Thus, etching oxides is different from etching metals. Similarly, plasma treatment of different materials yield different results, such as found with the favorable results attained with a plasma treatment of the bonding pads of this invention as disclosed later in the embodiments.

The mechanism of plasma etching, or plasma treatment in general, can in general be explained by the so-called fluorine-to-carbon ratio model, or F/C model, which is one of the two models that have been developed. Without going into the details that can be found in Wolf, the F/C ratio is the ratio of the fluorine-to-carbon species, which are the two "active species" involved in the etching of Si and $SiO_2$—as well as other materials etchable in fluorocarbon plasmas, including silicon nitride, $Si_3N_4$, titanium, Ti, and tungsten, W (but not the aluminum alloys that form the bonding pads). The F/C ratio model does not attempt to account for the specific chemistry taking place in the glow discharge of a plasma, but instead treats the plasma as a ratio of F to C species which can interact with the Si or $SiO_2$ surface. The generation of elimination of these "active species" by various mechanisms or gas additions then alters the initial F/C ratio of the inlet gas. Increasing the F/C ratio increases the Si etch rates, and decreasing the F/C ration lowers them.

Following Wolf, a pure $CF_4$ feed gas, for example, has an F/C ratio of 4 as evident from its formula. If the plasma environment causes Si etching, however, this phenomenon consumes F atoms without consuming any carbon, and thus the F/C ratio is reduced. If more Si surface is added to the etching environment, the F/C ratio is further decreased, and the etch rate is also reduced. The addition of $H_2$ to the $CF_4$ feed gas causes the formation of HF, but does not consume any carbon, thereby the F/C ratio and the etch rate are again reduced. Finally, the utilization of gases in which the F/C ratio is less than 4, such as $CHF_3$ or $C_3F_8$, also has the effect of producing an F/C ratio smaller than that present in a plasma of pure $CF_4$. Plasmas in which the F/C ratio is decreased to less than 4, are termed fluorine-deficient plasmas.

Conversely, the addition of $O_2$ has the effect of increasing the F/C ratio, because the oxygen consumes more carbon (by forming CO or $CO_2$), than F atoms (by the formation of $COF_2$). Other feed gases that can be added to increase the F/C ratio include $CO_2$, $F_2$, and $NO_2$.

In prior art, plasma treatment or plasma etching of various types of thin films have been developed. Thus, fluorocarbon-containing plasmas can be used to etch $SiO_2$, and selectivity with respect to Si can be obtained by using fluorine-deficient plasmas. Nitrides deposited by plasma-enhanced CVD can be etched in $CF_4$-oxygen plasmas. On the other hand, both fluorine and chlorine based plasmas are used for etching polysilicon. As for refractory metal silicides and polycides, a multi-step etch process involving both chlorine and fluorine plasmas may be utilized.

However, as is well known in the art, fluorine, or F-containing plasmas are not suitable for etching aluminum since the etch product, $AlF_3$, has a very low vapor pressure as shown in FIG. 18 of Wolf, p. 559. Chlorine based gases are instead used because the $AlCl_3$ halide of Al has sufficiently high vapor pressure to enhance desorption from the etched surface. Alloys of aluminum, such as aluminum-copper, or aluminum-silicon-copper exhibit higher degrees of difficulty in etching with increasing copper concentration. Here again, F-containing plasmas are not effective. However, it is shown later in the instant invention that by a judicious use of F-containing plasma, the aluminum-silicon-copper metal of bonding pads can be protected from the detrimental effects of color processing performed in forming CMOS image sensors.

In related art, Mautz, et al, in U.S. Pat. No. 5,476,816 disclose a metal etch processing sequence which eliminates the need to use an organic masking layer solvent and etches a portion of an insulating layer after the plasma etching step. The etch of the insulating layer is performed with an etching solution that may include 1,2-ethanediol, hydrogen fluoride, and ammonium fluoride. On the other hand, Imai, et al., in U.S. Pat. No. 5,716,494 disclose a dry etching method, chemical vapor deposition method, and apparatus for processing semiconductor substrate where $XeF_2$ gas is used as a process gas. A protective film is formed on the surface of a substrate to improve the profiles of an opening. An alcohol containing plasma is used by Tabara in U.S. Pat. No. 5,451,293 in making a wiring layer. An Al based wiring material layer is formed on an insulating film covering the surface of a semiconductor substrate. The wiring material is then selectively etched by a Cl base gas by using a resist layer as a mask, to form a wiring layer. The resist layer is ashed by using a plasma of a mixed gas of an H-and-O containing gas and a F containing gas, such as $O_2/CHF_3/CH_3OH$, without heating the substrate. Finally, Lee in U.S. Pat. No. 5,334,332 discloses cleaning compositions for removing etching residue from substrates containing hydroxylamine and at least one alkanolamine.

Also Harada in JP 03-136,240 and Kinoshita, et al., in JP59-132,622 show aluminum etch methods using F-containing gas plasma that form AlFx protective layers over the aluminum lines.

The plasma processes and the cleaning procedures of prior art fall short of addressing the problem of staining and pitting of bond-pads of semiconductor substrates subjected to color processing performed in forming image sensors. A plasma treatment which alleviates this problem is disclosed below in the embodiments of the present invention.

SUMMARY OF THE INVENTION

It is therefore an object of the present invention to provide a method of treating the bonding-pads on a semiconductor wafer with a plasma so as to prevent the formation of pitting and staining which cause poor quality wire bonding.

It is another object of this invention to provide a method of forming a passivation film on the bonding-pads on a wafer to improve the bonding of wires to the same pads.

It is yet another object of the present invention to provide a method of preventing the formation of pitting and staining on the bonding-pads on a wafer subjected to color filter processing of CMOS image sensors.

These objects are accomplished by providing a semiconductor wafer having a substructure comprising devices formed in said substrate, and insulating and metal layers formed thereon, including metal bonding-pads on the uppermost layer; depositing a layer of dielectric material over said semiconductor wafer including said metal bonding-pads; forming a passivation layer over said dielectric material; forming a photoresist mask having bonding-pad patterns over said passivation layer corresponding to underlying said metal bonding-pads; forming openings in said passivation layer and in said dielectric layer through said bonding-pad patterns in said photoresist mask over said metal bonding-pads; removing said photoresist mask, and performing plasma treatment of said metal bonding-pads through said openings with fluorine containing gases; forming a thin passivation film on said bonding-pads having fluorine, carbon and oxygen content; performing color filter process; and dicing chips from said wafer, bonding wires on said metal bonding-pads on said chips, and packaging said chips.

BRIEF DESCRIPTION OF THE DRAWINGS

In the drawings that follow, similar numerals are used referring to similar parts throughout the several views.

FIG. 1a is a top view of a portion of a semiconductor substrate showing the bonding-pads of prior art.

FIG. 1b shows a cross-sectional view of the bonding-pads of FIG. 1a, according to prior art.

DESCRIPTION OF THE PREFERRED EMBODIMENTS

Referring now the drawings, in particular to FIGS. 2a–2d, and FIG. 3, there is shown a method of treating the bonding-pads on a wafer with a fluorine containing plasma in order to prevent the formation of pitting and staining on the bonding-pads when the wafer is subjected to color filter processing of CMOS image sensors.

Figure 2A:
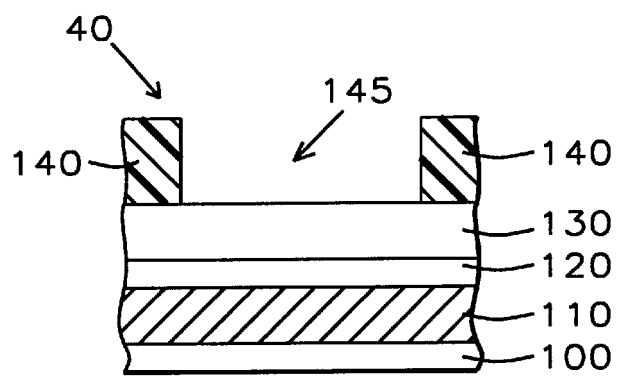
FIG. 2a is a cross-sectional view of a portion of a semiconductor wafer showing the forming of the bonding-pads of this invention.

FIG. 2a shows a cross-section of a semiconductor wafer having a substructure (100) comprising devices formed therein, and insulating and metal layers formed thereon, including bonding-pads on the uppermost metal layer (110). The various integrated circuit (IC) processes and methods The various integrated circuit (IC) processes and methods employed in the manufacture of semiconductor devices up to the step of forming bonding-pads will not be described here in order not to unnecessarily obscure the present invention for they are not significant to the invention and also are well known in the art.

In FIG. 2a, the uppermost metal layer, (110), can be aluminum-copper alloy, but aluminum-silicon-copper is preferred, and is patterned to form bonding-pad (40) using conventional methods. The thickness of metal (110) is between about 8000 to 9000 angstroms (A). Before depositing the final passivation layer (130), it is also preferred to first deposit a layer of phosphosilicate glass (PSG), though it is not necessary in all cases. PSG is deposited by chemical vapor deposition (CVD) to a preferred thickness between about 4500 to 5500 Å, and then is subjected to a temperature between about 360 to 440° C. to anneal an reflow the glass and to planarize the top surface of the semiconductor wafer. It will be noted that the phosphorous in the PSG helps prevent the glass from cracking near the bonding pad, and also serves to getter contaminants such as sodium. The final passivation layer, (130), is preferably silicon nitride ($Si_3N_4$) and is formed by reacting dichlorosilane ($SiCl_2H_2$) with ammonia ($NH_3$) in an PECVD at a pressure between about 2.3 to 2.4 torr, temperature between about 310 to 330° C. and at flow rates between about 360 to 420 standard cubic centimeters per minute (sccm). This layer seals the device structures on the wafer from contaminants and moisture, and also serves as a scratch protection layer.

Figure 2B:
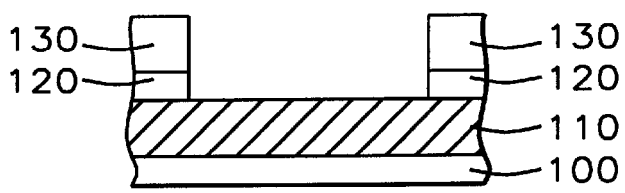
FIG. 2b is a cross-sectional view of a portion of the semiconductor wafer of FIG. 2a showing the opening of a hole in the passivation layers over the bonding-pad of this invention.

At the next step, bonding-pad openings (145) are formed by patterning passivation layer (130) with a photoresist mask (140) shown in FIG. 2a. Both passivation layer (130) and the underlying PSG layer (120) are etched using recipe $SF_6/O_2/He/CHF_3/CF_4$ as shown in FIG. 2b. The photoresist mask, (140), which has a thickness between about 2.0 to 2.2 μm, is then removed by oxygen plasma ashing.

Figure 2C:
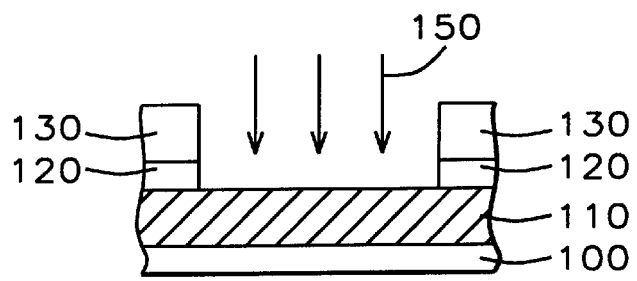
FIG. 2c is a cross-sectional view of a portion of the semiconductor wafer of FIG. 2b showing the F-plasma treatment of the bonding-pad of this invention.
Figure 2D:
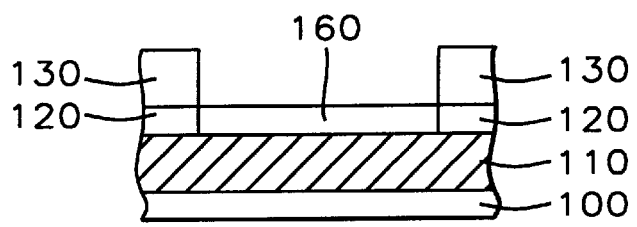
FIG. 2d is a cross-sectional view of a portion of the semiconductor wafer of FIG. 2c showing the forming of the thin protective passivation film of this invention.

As a main feature and key aspect of the present invention, the bonding-pads so exposed at the bottom of openings (145) are next subjected to a fluorine containing or F-plasma treatment (150) as shown in FIG. 2c, in an environment having a pressure between about 3.5 to 4.5 torr with gases $CF_4$ and He at flow rates between about 45 to 55 sccm, and 10 to 20 sccm, respectively, for a duration of between about 40 to 50 seconds, and at an energy level between about 95 to 105 watts. At the end of approximately the 50 seconds, a thin passivation film, (160), of about 50 to 70 Å is formed as seen in FIG. 2d. Numerous experiments have revealed that this thin passivation film over the aluminum alloy bonding-pad prevents the discoloration, staining and pitting of the bonding-pad when the wafer is subjected to the normal color filter processing of the CMOS image sensors.

Figure 3:
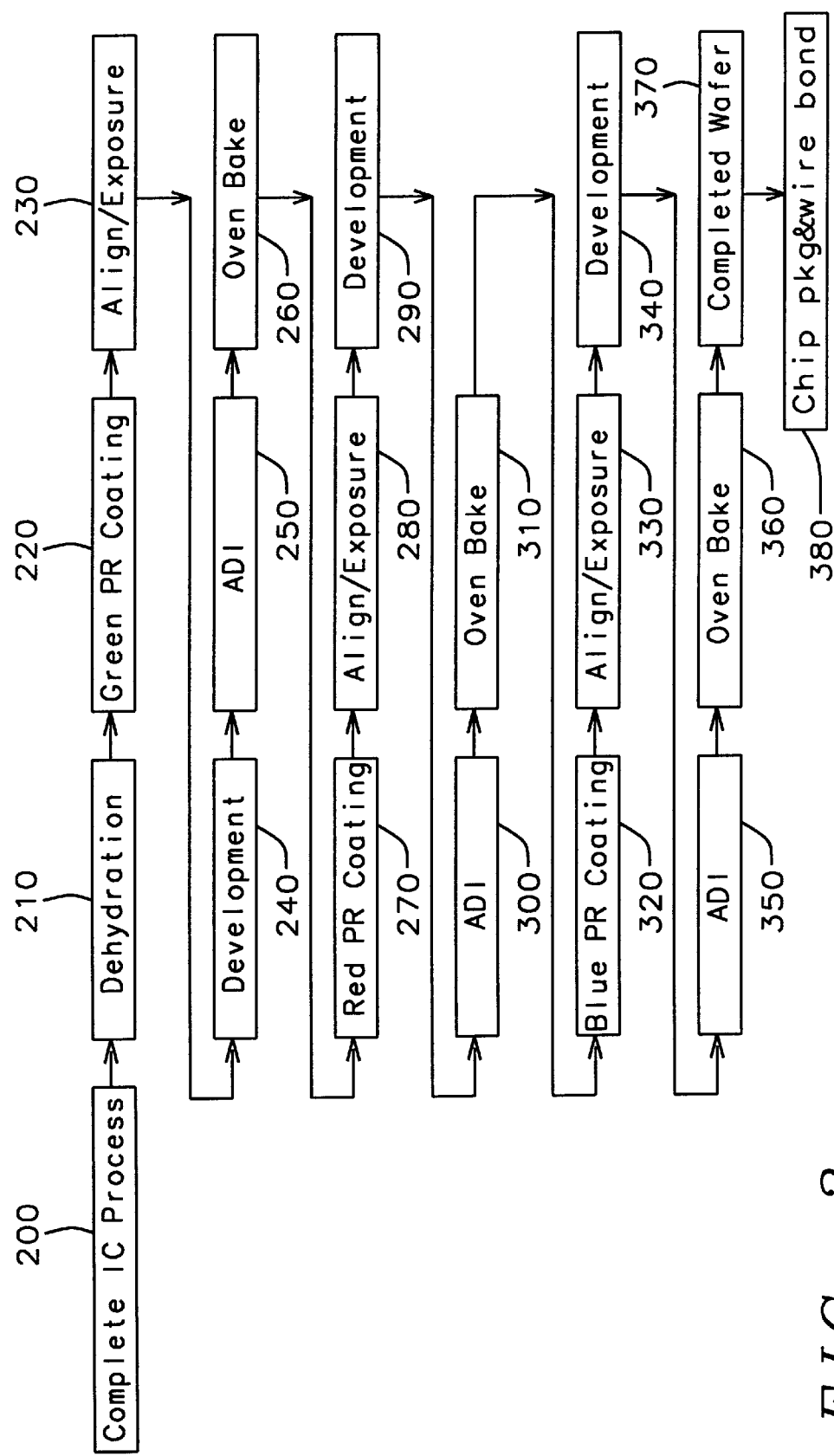
FIG. 3 shows the steps of performing a color filter process of the CMOS image sensors of this invention.

More specifically, wafers subjected to color filter process go through the steps shown in FIG. 3, where the colorized dye photoresist is coated on the passivation layer to form, ultimately, a CMOS image sensor such as the Charge Coupled Device. A wafer having completed the normal IC process as in step (200), is first dried, step (210). Then, a green negative dyed photoresist is coated over the wafer as in step (220), and exposed after proper alignment, step (230). The photoresist is next developed, ADI (After Develop Inspection) performed and then oven baked in steps (240), (250) and (260), respectively. Similar process steps are repeated as in (270), (280) and (290), but with a different photoresist, namely, negative Red dyed photoresist. At step (320), negative Blue dyed photoresist is used followed by alignment and exposure step (330). ADI steps (300) and (350) follow development steps (290) and (340), respectively, followed by oven bake steps of (310) and (360), respectively. The color filter process is completed in step (370). Subsequently, the completed wafer is diced into chips, and wire bonded using known packaging methods (380).

It will be noted from the process steps given in FIG. 3 that the wafer is developed three times, that is, once for each color photoresist used. The solution used for developing comprises Tetra-Methyl Ammonia Hydroxide made by Fuji-Hunt Electronic Technology Co., Ltd. It has been found in the present art of manufacturing practice that alloys of aluminum, such as aluminum-copper or aluminum-silicon-copper become stained and pitted when subjected to developing solutions. Consequently, wires bonded to the unprotected and pitted bonding-pads during packaging of the chips fail often. However, in experiments conducted with 108 samples having been treated with F-plasma, and then subjected to as many as 12 development steps, a substantial improvement in pull strength and shear strength of the wire bonds were observed.

An analysis of the thin passivation film formed on the bonding-pads by the F-plasma treatment shows that the protective film has a C,F, and O content, which prevents the formation of stain or pits. The presence of the film does not adversely affect the bonding of the wires. On the contrary, it enhances the bonding. In the absence of such a protective layer, it is found through electron spectroscopy chemical analysis (ESCA) that the developing solution tetra methyl ammonia reacts with the copper alloy of aluminum to form $Al_2Cu$ (Θ-phase), which is known to induce metal pits and pad staining. The pitting and staining become more pronounced with each development step.

While the invention has been particularly shown and described with reference to the preferred embodiments thereof, it will be understood by those skilled in the art that various changes in form and details may be made without departing from the spirit and scope of the invention.

What is claimed is:

1. A method of plasma treatment to prevent bonding-pad staining comprising the steps of:

providing a semiconductor wafer having a substructure comprising devices formed in said wafer, and insulating and metal layers formed thereon, including metal bonding-pads on the uppermost layer;

forming a passivation layer over said semiconductor wafer including said metal bonding-pads;

forming a photoresist mask having bonding-pad patterns over said passivation layer corresponding to underlying said metal bonding-pads;

forming openings in said passivation layer through said bonding-pad patterns in said photoresist mask over said metal bonding-pads;

removing said photoresist mask;

performing plasma treatment of said metal bonding-pads through said openings;

forming a passivation film on said bonding-pads;

performing color filter process; and dicing chips from said wafer, bonding wires on said metal bonding-pads on said chips, and packaging said chips.

2. The method of claim 1, wherein said metal bonding-pads comprise aluminum-copper alloy having a thickness between about 8000 to 9000 Å.

3. The method of claim 1, wherein said passivation layer comprises silicon nitride having a thickness between about 5000 to 7000 Å.

4. The method of claim 1, wherein said photoresist mask has a thickness between about 2.0 to 2.2 μm.

5. The method of claim 1, wherein said forming said openings in said passivation layer is accomplished with an recipe comprising $SF_6/He/O_2/CHF_3/CF_4$.

6. The method of claim 1, wherein said removing said photoresist mask is accomplished by performing oxygen plasma ashing.

7. The method of claim 1, wherein said plasma treatment is performed in an environment having a pressure between about 3.5 to 4.5 torr with gases $CF_4$ and He at flow rates between about 45 to 55 sccm, and 10 to 20 sccm, respectively, for a duration of between about 40 to 50 seconds, and at an energy level between about 95 to 105 watts.

8. The method of claim 1, wherein said passivation film comprises carbon, fluorine and oxygen content and has a thickness between about 50 to 70 angstroms (A).

9. A method of plasma treatment to prevent bond-pad staining comprising the steps of:

providing a semiconductor wafer having a substructure comprising devices formed in said substrate, and insulating and metal layers formed thereon, including metal bonding-pads on the uppermost layer;

depositing a layer of dielectric material over said semiconductor wafer including said metal bonding-pads;

forming a passivation layer over said dielectric material;

forming a photoresist mask having bonding-pad patterns over said passivation layer corresponding to underlying said metal bonding-pads;

forming openings in said passivation layer and in said dielectric layer through said bonding-pad patterns in said photoresist mask over said metal bonding-pads;

removing said photoresist mask, and performing plasma treatment of said metal bonding-pads through said openings;

forming a passivation film on said bonding-pads;

performing color filter process; and dicing chips from said wafer, bonding wires on said metal bonding-pads on said chips, and packaging said chips.

10. The method of claim 9, wherein said metal bonding-pads comprise aluminum-silicon-copper alloy having a thickness between about 8000 to 9000 Å.

11. The method of claim 9, wherein said depositing a layer of dielectric material is accomplished by chemical vapor deposition (CVD) of phosphosilicate glass (PSG) to a thickness between about 3000 to 5000 Å.

12. The method of claim 9, wherein said passivation layer comprises a plasma-enhanced (PECVD) silicon nitride having a thickness between about 5000 to 7000 Å.

13. The method of claim 9, wherein said photoresist mask has a thickness between about 2.0 to 2.2 $\mu$m.

14. The method of claim 9, wherein said forming said openings in said passivation layer and dielectric layer is accomplished with an etch recipe comprising $SF_6$/He/$O_2$/$CHF_3$/$CF_4$.

15. The method of claim 9, wherein said removing said photoresist mask is accomplished by performing oxygen plasma ashing.

16. The method of claim 9, wherein said plasma treatment is performed in an environment having a pressure between about 3.5 to 4.5 torr with gases $CF_4$ and He at flow rates between about 45 to 55 sccm, and 10 to 20 sccm, respectively, for a duration of between about 40 to 50 seconds, and at an energy level between about 95 to 105 watts.

17. The method of claim 9, wherein said passivation film comprises carbon, fluorine and oxygen content and has a thickness between about 50 to 70 angstroms (Å).

* * * * *